United States Patent
Kobayashi et al.

(10) Patent No.: US 6,589,672 B1
(45) Date of Patent: Jul. 8, 2003

(54) BLUE COLOR FILTER AND ORGANIC ELECTROLUMINESCENT DEVICE USING SAME

(75) Inventors: Ryoji Kobayashi, Kanagawa (JP); Yotaro Shiraishi, Kanagawa (JP); Koji Kawaguchi, Kanagawa (JP)

(73) Assignee: Fuji Electric Co., LTD, Kawasaki (JP)

( * ) Notice: Subject to any disclaimer, the term of this patent is extended or adjusted under 35 U.S.C. 154(b) by 0 days.

(21) Appl. No.: 09/547,819

(22) Filed: Apr. 11, 2000

(30) Foreign Application Priority Data

Apr. 26, 1999 (JP) .................................. 11-117929

(51) Int. Cl.[7] .................................. H05B 33/00
(52) U.S. Cl. .................. 428/690; 428/917; 313/504; 313/509
(58) Field of Search .................. 428/690, 917; 313/509, 504

(56) References Cited

U.S. PATENT DOCUMENTS

| | | | |
|---|---|---|---|
| 5,268,145 A | * 12/1993 | Namba et al. | 422/57 |
| 5,741,623 A | * 4/1998 | Namba et al. | 430/270.19 |
| 5,869,929 A | * 2/1999 | Eida et al. | 313/501 |
| 5,909,081 A | * 6/1999 | Eida et al. | 313/504 |
| 6,114,805 A | * 9/2000 | Codama et al. | 313/509 |
| 6,208,410 B1 | * 3/2001 | Kuwabara | 355/405 |
| 6,373,186 B1 | * 4/2002 | Arai et al. | 313/504 |

FOREIGN PATENT DOCUMENTS

| | | |
|---|---|---|
| EP | 387715 A2 | 9/1990 |
| EP | 723167 A2 | 7/1996 |
| GB | 2313921 A2 | 12/1997 |
| JP | 10-272844 | * 10/1998 |

* cited by examiner

Primary Examiner—Cynthia H. Kelly
Assistant Examiner—Dawn Garrett
(74) Attorney, Agent, or Firm—Darby & Darby

(57) ABSTRACT

A blue color filter is provided, having high transmittance for the color blue and low transmittance for the color green. An organic electroluminescent device is provided having excellent blue color purity. The blue color filter according to the invention includes a photosensitive resin; and a dye containing a cyanine dye described by the following structural formula (I):

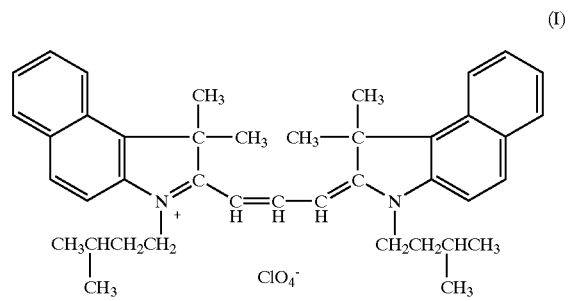

The organic EL device includes a blue color filter made with cyanine dye having the structural formula (I), a glass substrate, an organic protection layer, an inorganic oxide layer, and an organic light-emitting layer including an anode, a hole injection layer, a hole transport layer, a light emitting layer, an electron injection layer and a cathode.

12 Claims, 2 Drawing Sheets

BLUE COLOR FILTER AND ORGANIC ELECTROLUMINESCENT DEVICE USING SAME

BACKGROUND OF THE INVENTION

The present invention relates to a blue color filter that includes a dye or a pigment. The present invention also relates to a blue color filter that is typically used in combination with an organic electroluminescent element (hereinafter referred to as an "EL element").

Research and development of various display devices have been vigorously explored to meet the increasing demand for flat panel displays to replace conventional cathode ray tubes (CRT's). EL elements have been developed as all-solid-state and self-light-emitting devices to meet this demand. The EL elements have attracted much attention due to their high definition and high visibility, which the other display devices are unable to attain.

Various measures have been proposed for providing flat panel displays with polychromatic-display function or full-color-display function. Japanese Unexamined Laid Open Patent Applications S57-157487, S58-147989 and H03-214593 disclose flat panel displays that arrange light emitters for the three primary colors, i.e. green-light emitters, blue-light emitters and red-light emitters, in a matrix. The light emitters for the respective colors emit light independently. In order to apply an organic EL element to this type of flat panel display, fine and precise arrangement of the three kinds of light emitting materials is required in the matrix for each of the three primary colors. However, it is difficult to obtain fine and precise arrangement of the three kinds of light emitting materials in a matrix without increasing manufacturing costs. In addition, color deviations occur over time because the lives of the three kinds of light emitters are different from one another. The x-value and the y-value on the Commission Internationale de l'Eclairage (CIE) color coordinates for the reported blue organic EL device are 0.16 and 0.15, respectively (cf. Japanese Unexamined Laid Open Patent Application H08-286033). Comparing the CIE color coordinates for the reported blue organic EL device to the NTSC hue (that is a hue of standard blue for CRT's corresponding to x=0.14 and y=0.08 on the CIE color coordinate scale), reveals that the blue color from the reported blue organic EL device is not pure enough.

Japanese Unexamined Laid Open Patent Applications H01-315988, H02-273496 and H03-194895 disclose flat panel displays which dispose color filters on a white back light source so that the three primary colors may be obtained through the color filters. This configuration requires white light with high luminance in order to obtain the three primary colors with high luminance. However, an organic EL element capable of emitting white light with high luminance for long durations has not yet been obtained.

Japanese Unexamined Laid Open Patent Application H03-152897 discloses a color conversion arrangement where fluorescent materials are arranged two-dimensionally and separately convert the light from a light emitter to fluorescent light of desired colors. This color conversion arrangement is applied to CRT's and flat panel displays. Japanese Unexamined Laid Open Patent Applications H03-152897 and H05-258860 disclose a color conversion method that uses fluorescent materials for color filters. The flourescent materials absorb light in the range of light emitted by an organic EL element and then emit visible fluorescent light. An organic EL element that emits brighter light than visible light is more suitable as the light source since the organic EL element should emit light that is not limited to white. Japanese Unexamined Laid Open Patent Applications H03-152897, H08-286033 and H09-208944 disclose color conversion arrangements that use a blue-light-emitting organic EL element and convert the blue light to the wavelengths (colors) of green and red. A full-color light-emitting-type display that uses light with low energy such as near ultraviolet light and visible light is constructed by finely and precisely patterning a fluorescent light conversion film that contains fluorescent pigments.

Color filters used in combination with organic EL elements include a matrix of pixels for the three primary colors or a black matrix. The matrix is formed on a glass substrate by a dying method, a printing method, a pigment dispersion method or other similar methods.

In the dying method, a coloring material is made by dying a natural photosensitive resin such as gelatin, or a synthetic photosensitive resin such as aminated poly(vinyl alcohol) with an acidic dye. A color filter is obtained by coating the coloring material onto a glass substrate (cf. Japanese Examined Patent Application H01-5273). The coating film obtained by the dying method has problems with weather resistance, thermal resistance and moisture resistance.

In the printing method, a color filter is obtained by using a printing ink made by dispersing a pigment in a thermosetting resin or in an ultraviolet-ray-curing resin (cf. Japanese Unexamined Laid Open Patent Applications S62-54774 and S63-129303). The flatness and smoothness of the printed ink film surface pose certain problems and interfere with precise positioning of the color filter patterns for the three primary colors.

In the pigment dispersion method, small grains of 1 $\mu$m or less in diameter of a red pigment, a blue pigment or a green pigment are dispersed in a photosensitive resin solution. The solution is then coated onto a glass substrate. The resulting photosensitive resin film is patterned by photolithography to form a desired pixel pattern (cf. Japanese Examined Patent Application H04-37987 and H04-39041).

Color filters made by the pigment dispersion method are used mainly to achieve the thermal resistance required for making color displays, the weather resistance required for using the displays and to the precision and fineness required for displaying images.

Color displays today must possess fine and precise pixel arrangement, display images with full colors and reduce power consumption. Most of the demand for electric power in operating the conventional color displays is for the back light. To meet these demands, it is necessary to improve the color purity, the chroma and the amount of light transmitted through the color filter. In order to increase the amount of light transmitted through the color filter, the amount of pigment in the photosensitive resin or the thickness of the film of pixels has been reduced.

However, the methods for increasing light transmission through the color filter reduce the chroma of the color filter. The reduced chroma impairs the brightness of the colors to be displayed and causes whitened images including the background. When the coloring pigment content is increased so as not to impair the chroma of the color filter, displayed images including the background are darkened. When the light intensity of the back light is increased to maintain brightness of the displayed images as well as the background, electric power consumption of the display is increased.

To improve the amount of light transmission, the diameter of the dispersed pigment particles are reduced to less than ½ of the wavelength of the color that the pigment exhibits (Kiyoshi Hasizume, JOURNAL of THE JAPAN SOCIETY of COLOR MATERIAL, December 1967, p. 608). Since the wavelength of the color that the blue pigment exhibits is shorter than the wavelengths of the colors which the green and red pigments exhibit, the blue pigment should be pulverized and dispersed more finely than the red and green pigments. This will increase manufacturing costs. In addition, stability of the dispersed pigment particles is reduced when the particles are too finely pulverized, posing a further problem.

Copper phthalocyanine blue having a crystal form of α-type, β-type or —type has been used widely as a blue pigment (HANDBOOK of COLOR MATERIAL ENGINEERING, p. 333, edited by THE JAPAN SOCIETY of COLOR MATERIAL). When α-type copper phthalocyanine blue is used alone as a blue pigment in the color filter, its tinting strength is not very strong. A lot of pigment must be mixed into the photosensitive resin in order to obtain the desired chroma. But then, problems with thermal discoloration of the formed color filter and adhesiveness of the color filter and the glass substrate occur. Moreover, the amount of light transmission at wavelengths greater than 600 nm is excessive, impairing color purity.

When copper phthalocyanine blue of —type is used alone, less is required as compared to using α-type copper phthalocyanine blue. The amount of —type needed to be added to the photosensitive resin is less because of its excellent tinting strength. However, as the mixing ratio of the pigment is increased to obtain the desired chroma, more shading is caused at the 365 nm wavelength. This interferes with effective curing of the photosensitive resin and results in reduced photo-curing sensitivity. This reduction in photo-curing sensitivity causes a reduction of the thickness of the developed film and distorts the pattern of the pixels.

When β-type copper phthalocyanine blue is used alone, a large deviation from the desired NTSC hue is caused because β-type copper phthalocyanine blue is greenish blue.

A color filter using a pigment mixture containing copper phthalocyanine blue and dioxazine violet has been proposed (cf. Japanese Examined Patent Application H06-95211, Japanese Unexamined Laid Open Patent Application H01-200353 and Japanese Examined Patent Application H04-37987). By using a color mixture of any of the three kinds of copper phthalocyanine blue and I. C. Pigment Violet 23, a kind of dioxazine violet is produced, light transmission between 500 and 550 nm is suppressed and the color purity is improved. However, light transmission in the desired blue range between 420 and 500 nm is also suppressed, causing insufficient brightness of the displayed images including the background. In actual operation of the display, use of a polarizer plate results in a reduction in light transmission for the desired blue range of from 70 to 80% compared to the light transmission for the other color ranges. Therefore, it has been necessary to increase the amount of light transmission through the blue color filter.

OBJECTS AND SUMMARY OF THE INVENTION

In light of the above, it is an object of the invention to provide a blue color filter having high transmittance of blue color and low transmittance of green color.

It is another object of the invention to provide an organic electroluminescent device that exhibits excellent and pure blue color.

Briefly stated, the present invention is a blue color filter including a photosensitive resin and a dye containing at least a first cyanine dye described by the following structural formula (I):

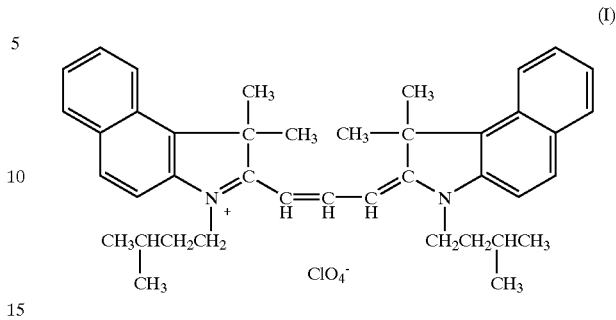

An embodiment of the present invention is a blue color filter including a photosensitive resin and a pigment containing at least a first cyanine dye described by the aforementioned structural formula (I).

Advantageously, the blue color filter contains from 0.5 to 30 weight parts of the first cyanine dye with respect to 100 weight parts of the photosensitive resin.

Advantageously, the dye containing the first cyanine dye further contains a second cyanine dye described by the following structural formula (II):

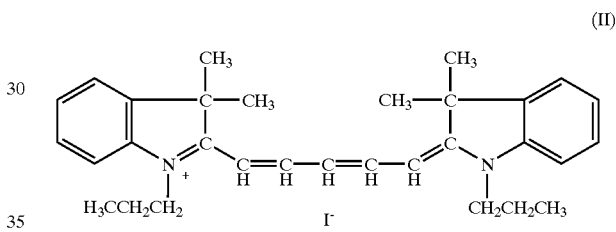

Advantageously, the content of the second cyanine dye is from 0.5 to 1.5 weight parts with respect to 1 weight part of the first cyanine dye.

According to another embodiment of the invention, a blue color filter is provided including: a photosensitive resin; and a pigment containing at least a first cyanine dye described by the foregoing structural formula (I).

Advantageously, the pigment containing the first cyanine dye further contains copper phthalocyanine blue.

According to still another embodiment of the invention, an organic electroluminescent device is provided including: any of the blue color filters described above and an organic electroluminescent element laminated onto the blue color filter.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1:
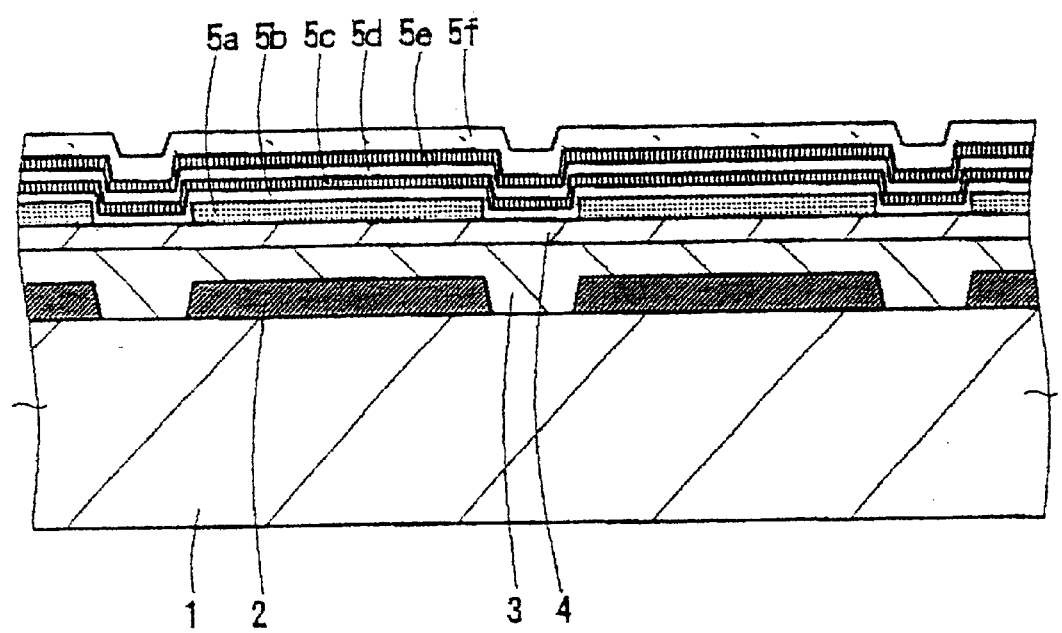
FIG. 1 is a cross section of an organic electroluminescent device including a blue color filter according to the present invention.

The present inventors have performed extensive research to provide a blue organic EL device that facilitates balancing the color purity and the luminance with each other, displaying fine and precise images and reducing the power consumption. The present inventors have found that the cyanine dye described by the foregoing structural formula (I) suppresses light transmission in the wavelength range between 500 and 550 nm and improves color purity. The color filter formed from a blue material containing the cyanine dye described by structural formula (I) transmits a greater amount of light than a blue color filter formed from a blue material containing copper phthalocyanine blue. The blue organic EL device of the present invention is obtained by combining the present color filter and an organic EL element.

The blue material used in the blue color filter of the present invention contains a photosensitive resin and a blue dye mixed in the photosensitive resin. The main component of the blue dye is a cyanine dye described by the following structural formula (I):

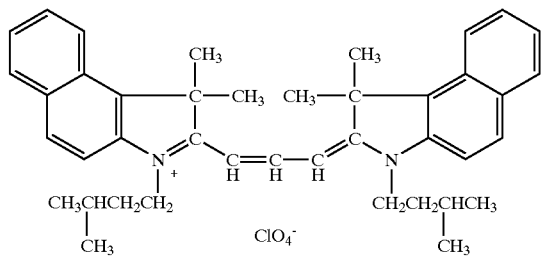

(I)

The blue dye used in the blue color filter of the present invention contains the cyanine dye described by structural formula (I). This cyanine dye is used alone or in combination with other dyes. Since the cyanine dye described by the structural formula (I) is chemically and thermally quite stable, the blue color filter containing this cyanine dye is very thermally resistant, even when the blue color filter is formed by methods other than the pigment dispersion method. The cyanine dye described by structural formula (I) is compatible with a copper phthalocyanine blue pigment.

The blue material of the present invention includes a photosensitive resin and the cyanine dye described by structural formula (I) as its main constituents. The mixing ratio of the cyanine dye is preferably from 0.1 to 40 weight parts of dye with respect to 100 weight parts of the photosensitive resin. Using the cyanine dye described by the structural formula (I) as a main component in a color filter suppresses light transmission between 500 and 550 nm's and improves color purity. The mixing ratio of the cyanine dye is more preferably from 0.5 to 30 weight parts with respect to 100 weight parts of the photosensitive resin.

When the film of blue pixels formed on a substrate using the blue material of the present invention is from 1 to 20 $\mu$m thick and the content of the cyanine dye described by structural formula (I) is more than 30 weight parts, then the light transmission in the range between 420 and 500 nm is suppressed. When the film of blue pixels formed on a substrate from the blue material of the present invention is between 1 and 20 $\mu$m thick and the content of the cyanine dye described by the structural formula (I) is less than 0.5 weight parts, then light transmission in the range between 500 and 550 nm is not suppressed sufficiently, and there is no improvement in color purity.

The cyanine dye described by structural formula (I) may be used as a pigment. A dispersive blue pigment is prepared by any method known to those skilled in the art. For example, a dispersive blue pigment containing the cyanine dye described by the structural formula (I) may be prepared by finely dispersing and stabilizing copper phthalocyanine blue and the cyanine dye described by the structural formula (I) in an organic solvent containing a pigment derivative using a dispersing means such as a sand mill. A dispersing agent may be added if necessary to stabilize the dispersion.

The photosensitive resin used for the blue color filter of the present invention contains an organic resin binder that is developed by an alkaline developing agent, a photo-polymerizing multi-functional cross-linking agent, a photo-polymerization initiator and a sensitizer. Hereinafter, the resin binder, the compound or the functional group that participates in development via an alkaline developing agent will be referred to as the "alkali-developing resin binder", "the alkali-developing compound" or the "alkali-developing functional group", respectively.

Alkali-developing organic resin binders may include a copolymer of: 1. an unsaturated organic oxide having a polymerizing double bond and one or more carboxyl groups, and 2. an unsaturated compound having a polymerizing double bond. Examples of the unsaturated organic oxide include acrylic acid, methacrylic acid, maleic anhydride, maleic acid and crotonic acid. Examples of the unsaturated compound having a polymerizing double bond include ethyl methacrylate, 2-hydroxyethyl methacrylate, benzyl methacrylate, styrene and isobutyl vinyl ether. Although the carboxyl group in the resin binder facilitates developing the resin binder with an alkaline agent, it does not contribute to photo-polymerization. The resin binder is used solely for ease of film formation.

The photo-polymerizing multifunctional cross-linking agent includes compounds having two or more polymerizing double bonds, including acrylates and methacrylates such as ethylene glycol diacrylate, ethylene glycol dimethacrylate, diethylene glycol diacrylate, diethylene glycol dimethacrylate, triethylene glycol diacrylate, triethylene glycol dimethacrylate, tetraethylene glycol diacrylate, tetraethylene glycol dimethacrylate, tetramethylene glycol diacrylate, tetramethylene glycol dimethacrylate, trimethylol propane triacrylate, trimethylol propane trimethacrylate, trimethylol ethane triacrylate, trimethylol ethane trimethacrylate, pentaerythritol diacrylate, pentaerythritol dimethacrylate, pentaerythritol triacrylate, pentaerythritol trimethacrylate, pentaerythritol tetraacrylate, pentaerythritol tetramethacrylate, dipentaerythritol tetraacrylate, dipentaerythritol tetramethacrylate, dipentaerythritol hexaacrylate, dipentaerythritol hexamethacrylate, glycerol acrylate, and glycerol methacrylate; and acrylates of bisphenol epoxy such as 2,2-bis(4-hydroxy phenyl)propane and 9,9-bis(4-hydroxy phenyl)olefin. These compounds are used alone or in an appropriate combination.

A compound that works both as an alkali-developing resin binder and as a photo-polymerizing multifunctional cross-linking agent may also be used as an organic resin binder. Such a compound has a carboxyl group, a group that facilitates development by an alkaline developing agent and an ethylenic unsaturated double bond. Such a compound may be obtained by reacting the hydroxy group of epoxy-acrylate or epoxy methacrylate with polybasic acid or the anhydride of the polybasic acid to form acid addition products. The epoxy acrylate or epoxy methacrylate is formed by reacting an epoxy compound with an acrylic acid or a methacrylic acid, respectively. This type of organic resin binder is preferred in order to obtain large differences in solubility between the cross-linked portions that are exposed to the exposure light and the portions that are not exposed.

An excellent pattern of blue pixels and a cured blue color filter film that exhibits excellent thermal resistance and excellent alkali resistance is obtained using this type of alkali developing resin binder.

The epoxy compounds used for the above described reactions include bis(4-hydroxy phenyl)ketone, bis(4-hydroxy-3,5-dimethylphenyl)ketone, bis(4-hydroxy-3,5-dichlorophenyl)ketone, bis(4-hydroxyphenyl)sulfone, bis(4-hydroxy-3,5-dimethylphenyl)sulfone, bis(4-hydroxy-3,5-dichlorophenyl)sulfone, bis(4-hydroxyphenyl) hexafluoropropane, bis(4-hydroxy-3,5-dimethyl phenyl) hexafluoropropane,bis(4-hydroxy-3,5-dichlorophenyl) hexafluoropropane, bis(4-hydroxyphenyl)dimethylsilane, bis(4-hydroxy-3,5-dimethyl phenyl)dimethylsilane, bis(4-hydroxy-3,5-dichlorophenyl)dimethylsilane, bis(4-hydroxyphenyl)methane, bis(4-hydroxy-3,5-dichlorophenyl)methane, bis(4-hydroxy-3,5-dibromophenyl)methane, 2,2-bis(4-hydroxyphenyl) propane, 2,2-bis(4-hydroxy-3,5-dimethylphenyl)propane, 2,2-bis(4-hydroxy-3,5-dichlorophenyl)propane, 2,2-bis(4-hydroxy-3-methylphenyl)propane, 2,2-bis(4-hydroxy-3-chlorophenyl)propane, bis(4-hydroxyphenyl)ether, bis(4-hydroxy-3,5-dimethylphenyl)ether, and bis(4-hydroxy-3,5-dichlorophenyl)ether; compounds having a fluorene skeleton such as 9,9-bis(4-hydroxy phenyl)fluorene, 9,9-bis(4-hydroxy-3-methylphenyl)fluorene, 9,9-bis(4-hydroxy-3-chlorophenyl)fluorene, 9,9-bis(4-hydroxy-3-bromophenyl) fluorene, 9,9-bis(4-hydroxy-3-fluorophenyl)fluorene, 9,9-bis(4-hydroxy-3-methoxy phenyl)fluorene, 9,9-bis(4-hydroxy-3,5-dimethylphenyl)fluorene, 9,9-bis(4-hydroxy-3,5-dichlorophenyl)fluorene, and 9,9-bis(4-hydroxy-3,5-dibromo phenyl)fluorene; and epoxy resins obtained by epoxidating the bisphenol components such as 4,4'-bsiphenol and 3,3'-bsiphenol, phenol novolak-type epoxy, cresol novolak-type epoxy, polycarboxylic acid glycidyl ester, polyol polyglycidyl ester, aliphatic or alicyclic epoxy resins, and amine epoxy resins. Although oligomer units are mixed with the above described epoxy compounds and resins during glycidyl etherification, the oligomer units do not interfere with the characteristics of the resin compositions.

The polybasic acid and the anhydride of the polybasic acid include maleic anhydride, succinic anhydride, itaconic anhydride, phthalic anhydride, tetrahydrophthalic anhydride, hexahydrophthalic anhydride, methyl-5-norbornene-2,3-dicarboxylic anhydride, 1,4,5,6,7,7-hexachloro-5-norbornene-2,3-dicarboxyl anhydride, methyltetrahydrophthalic anhydride, and trimellitic anhydride; and aromatic carboxylic dianhydrides such as pyromellitic anhydride, 3,3',4,4'-benzophenonetetracarboxylic dianhydride, biphenyltetracarboxylic dianhydride, and biphenylethertetracarboxylic dianhydride.

The polybasic acid and the anhydride of the polybasic acid may also be half-esterified compounds. The half-esterified compounds are obtained by reacting maleic anhydride with: 1. acrylate such as hydroxyethyl acrylate, having an alcoholic hydroxy group in the maleic anhydride portion of the copolymer, or 2. acrylate such as glycidyl methacrylate having an epoxy group in the maleic anhydride portion of the copolymer. Copolymers are obtained by co-polymerizing maleic anhydride or its derivatives with a compatible monomer. Suitable monomers includes ethylene, propylene, isobutene, styrene, vinyl phenol, any of their ether derivatives, any of their ester derivatives, acrylic acid, acrylate and acrylamide.

The polybasic acid and the anhydride of the polybasic acid may also be compounds obtained by reacting acrylic acid or methacrylic acid with the hydroxyl group in an acrylate copolymer having alcoholic hydroxyl groups. The acrylate copolymer is obtained by reacting acrylic acid, methacrylic acid, acrylate or methacrylate with an acrylate having an alcoholic hydroxyl group such as hydroxyethyl acrylate.

The photo-polymerizing compounds having an ethylenic unsaturated double bond and a carboxylic group are not limited to those described above. In addition, the photo-polymerizing compounds described above may be used alone or in an appropriate combination.

The photo-polymerization initiator and/or the sensitizer includes acetophenone compounds such as acetophenone, 2,2-diethoxyacetophenone, p-dimethylacetophenone, p-dimethylaminopropyophenone, dichloroaceto-phenone, trichloroacetophenone, and p-tert-butylacetophenone; benzo-phenone compounds such as benzophenone, 2-chlorobenzophenone and p,p'-bisdimethylaminobenzophenone; benzoisoether compounds such as benzyl, benzoin, benzoin methyl ether, benzoin isopropyl ether, and benzoin isobutyl ether; sulfur compounds such as benzyl methylketal, thioxanthone, 2-chlorothioxanthone, 2,4-diethylthioxanthone, 2-methylthioxanthone, and 2-isopropylthioxanthone; anthraquinone compounds such as 2-ethyl-anthraquinone, octamethylanthraquinone, 1,2-benzanthraquinone, and 2,3-diphenylanthraquinone; organic peroxides such as azobisisobutylnitryl, benzoin peroxide, and cumene peroxide; and thiol compounds such as 2-mercaptobenzimidazole, 2-mercaptobenzoxazole, and 2-mercaptobenz-thiazole. These compounds are used alone or in an appropriate combination.

A compound, that does not work as a photo-polymerization initiator alone but promotes initiation of photo-polymerization when used in combination with any of the foregoing photo-polymerization initiators, may be added. For example, tertiary amine compounds such as triethanolamine, that is effectively combined with benzophenone, may be used. The preferred mixing ratio of the photo-polymerization initiator is from 0.1 to 30 weight parts with respect to 100 weight parts of the photo-polymerizing compound. When the mixing ratio is less than 0.1 weight parts, the rate of photo-polymerization is low, resulting in a low sensitivity. When the mixing ratio is more than 30 weight parts, the light does not reach inside the resin compositions, causing uncured portions to remain. The remaining uncured portions impair the physical properties of the resin such that the adhesiveness between the substrate and resin is not strong enough.

These components are dissolved or dispersed into a solvent to obtain a photosensitive resin used in the invention. If necessary, ingredients such as a thermal-polymerization inhibitor, a plasticizer, a filler, a solvent, a leveling agent and an antifoaming agent are added.

The solvent includes ketone compounds such as methylethylketone, and methylisobutylketone; cellosolve compounds such as methyl cellosolve, ethyl cellosolve, butyl cellosolve, and cellosolve acetate; esters such as butyl acetate, ethiscellosolve acetate, ethyl lactate, and propylene glycol monomethylether acetate; and lactone compounds such as γ-butyrolactone. The thermal-polymerization inhibitor includes hydroquinone, hydroquinone monomethyl ether, pyrogallol, tert-butyl catechol, and phenothiazine. The plasticizer includes dibutyl phthalate, dioctyl phthalate, and tricresyl phosphate. A filler such as carbon black, barium oxide, silica, mica, and alumina may be added if necessary. The antifoaming agent and/or leveling agent includes silicon compounds, fluorine compounds and acrylic compounds.

The blue material used in the blue color filter of the present invention is prepared in the following way. A photosensitive resin solution is prepared by mixing an optically transparent photosensitive resin, a photo-polymerization initiator and a sensitizer at a predetermined ratio and by dissolving the mixture into a predetermined solvent. The photosensitive resin solution and a blue dye containing the compound described by structural formula (I) are mixed at a desired ratio, resulting in a blue material for image formation. If necessary, the blue material is diluted so that a desired solid concentration is obtained.

The blue material thus obtained is coated onto a transparent substrate, such as a glass substrate, at a desired thickness. The blue material film is patterned by photolithography to form blue pixels. A polychromatic color filter is made by forming red pixels and/or green pixels using red material for image formation and/or green material for image formation, respectively, either before or after the blue pixel formation.

Finally, a polychromatic organic EL device is obtained by forming an organic EL element that works as a back light source on the color filter.

The present invention will be explained hereinafter in connection with certain preferred embodiments.
First embodiment (E1)
Fabrication of a Blue Color Filter An optically-transparent photo-polymerizing resin (259PAP5 supplied from Nippon Steel Chemical Co., Ltd.), containing 2 weight parts of a cyanine dye described by the structural formula (I) with respect to 100 weight parts of the solid component of the resin, is used as a blue material for image formation. The blue material is coated onto a substrate by spin-coating and dried, resulting in a blue material film. The resulting blue material film is 8 µm thick. The blue material film is exposed by contact exposure to light from a high-pressure mercury lamp through a mask to obtain a stripe pattern having a 0.33 mm line pitch and 0.12 mm gap. A stripe pattern is formed by developing the exposed blue material film with alkaline aqueous solution. Then, by drying the developed stripe pattern, a blue color filter having a stripe pattern of 0.33 mm line pitch and 0.07 mm gap is obtained.

Figure 2:
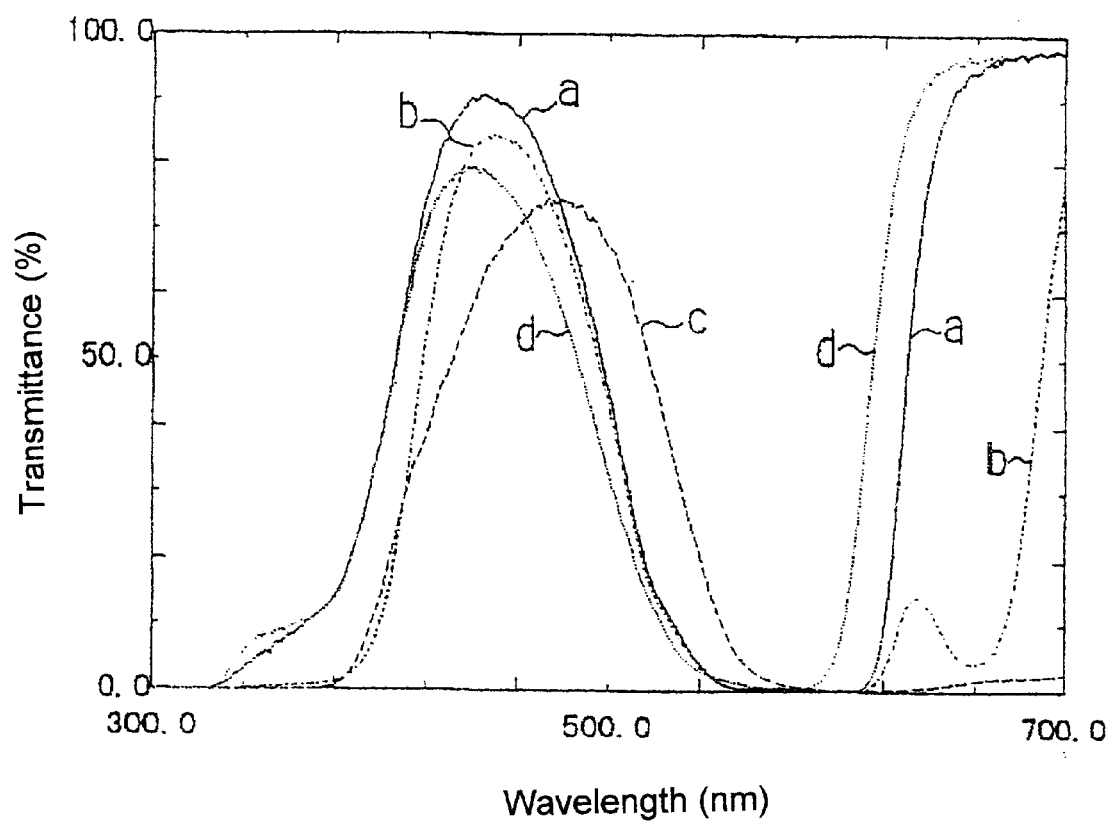
FIG. 2 is a set of spectroscopic transmittance curves of the blue color filters according to the present invention.

Spectroscopic transmittance of the blue color filter is measure. FIG. 2 is a set of spectroscopic transmittance curves of the blue color filters of the present invention. Curve "a" represents the spectroscopic transmittance of the blue color filter made according to the first embodiment.

Fabrication of an Organic EL Plate

FIG. 1 is a cross section of an organic EL device including a blue color filter of the present invention. Referring now to FIG. 1, an organic EL device including a blue color filter according to the invention includes a glass substrate 1, a blue color filter 2 on the glass substrate 1, an organic protection layer 3 covering the blue color filter 2, an inorganic oxide layer 4 on the organic protection layer 3, and an organic light-emitting layer on the organic protection layer 3. The organic light-emitting layer includes an anode 5a, a hole injection layer 5b on the anode 5a, a hole transport layer 5c on the hole injection layer 5b, a light emitting layer 5d on the hole transport layer 5c, an electron injection layer 5e on the light emitting layer 5d, and a cathode 5f on the electron injection layer 5e.

An acrylate photo-curing resin (259PAP5 supplied from Nippon Steel Chemical Co., Ltd.) is coated on the blue color filter described above and dried, resulting in an organic protection layer 3. The resulting organic protection layer 3 is 10 µm thick. An inorganic oxide layer 4 that is 100 nm thick is formed by sputtering $SiO_2$ on the organic protection layer 3. A transparent electrode layer (ITO) is formed on the inorganic oxide layer 4. A photoresist agent (OFRP-800 supplied from Tokyo Ohka Kogyo Co., Ltd.) is coated on the ITO layer, resulting in a photoresist film. Then, the ITO layer is patterned by photolithography, resulting in an anode 5a, having a 0.33 mm line pitch and 0.07 mm gap.

The laminate thus form is loaded in a resistance-heating vacuum deposition chamber. Then, the vacuum deposition chamber is evacuated down to $1 \times 10^{-4}$ Pa, and a hole injection layer 5b, a hole transport 5c, a light emitting layer 5d and an electron injection layer 5e are formed sequentially without breaking the vacuum of the chamber. Table 1 lists the materials for the respective organic layers and their structural formulae. The hole injection layer 5b is a 100 nm thick copper phthalocyanine (CuPc) layer. The hole transport 5c is a 20 nM thick 4,4'-bis[N-(1-naphthyl)-N-phenyl amino]biphenyl (α-NPD) layer. The light emitting layer 5d is a 30 nm thick 4,4'-bis(2,2-dipheny vinyl)]biphenyl (PDVBi) layer. The electron injection layer 5e is a 20 nm thick tris(8-hydroquinoline)aluminum complex (Alq) layer. The organic EL element emits blue light having a peak at 470 nm. Table 1 appears on the following page.

| Layers | Materials | Structural Formulae |
|---|---|---|
| Hole injection layer | Copper phthalocyanine | 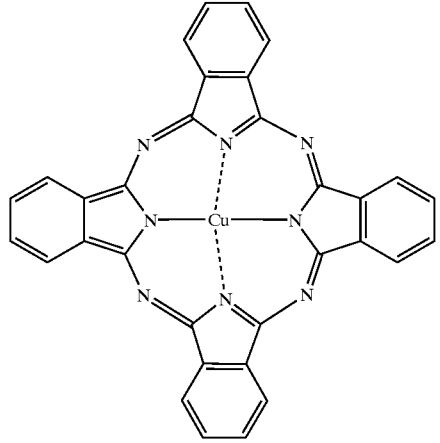 |

-continued

| Layers | Materials | Structural Formulae |
|---|---|---|
| Hole transport layer | 4,4'-bis[N-(1-naphthyl)-N-phenyl amino]biphenyl | |
| Light emitting layer | 4,4'-bis(2,2-dipheny vinyl)]biphenyl | |
| Electron injection layer | Tris(8-hydroquinoline) aluminum complex | |

The laminate thus formed is then removed from the vacuum deposition chamber and a mask is put on the laminate. A 200 nn thick metallic layer containing Mg and Ag at a ratio of 1:10 is formed. A stripe pattern of a cathode 5f, having a 0.33 mm line pitch and 0.07 mm gap, is formed perpendicular to the ITO lines.

The organic EL device including the blue color filter is sealed with a sealant glass using a UV-curing agent in a dry nitrogen atmosphere in a glove box. The conversion efficiency of the organic EL device fabricated as described above is measured. The x- and y-values of the CIE color coordinates are measured using a color meter.

A reference organic EL device, not including any blue color filter, is made. The current value when the reference organic EL device emits light at the luminance of 100 cd/m$^2$ is defined as a standard current. The conversion efficiency is defined as the luminance of light that the organic EL device with the blue color filter emits at the standard current.

Conversion efficiency (%)=
[(Luminance of the organic EL device including the blue color filter)/(Luminance of the reference organic EL device)]×100=
Luminance of the organic EL device including the blue color filter The CIE color coordinates are determined by feeding the standard current to the organic EL device and by measuring the blue light through the blue color filter with a color meter (MCPD-1000 supplied from Otsuka Electronics Co., Ltd.).

Second embodiment (E2)

A blue color filter (E2) of the second embodiment is made in the same way as the blue color filter of the first embodiment except that the blue material contains 2 weight parts of the cyanine dye described by structural formula (I) and 2 weight parts of the cyanine dye described by structural formula (II) with respect to 100 weight parts of the solid component of the optically transparent photo-polymerizing resin (259PAP5 supplied from Nippon Steel Chemical Co., Ltd.). The spectroscopic transmittance of the blue color filter according to the second embodiment is measured and described by the curve "b" in FIG. 2.

An organic EL device is made using the blue color filter of the second embodiment. The conversion efficiency and the x- and y-values on the CIE color coordinates are measured. The conversion efficiency and the x- and y-values on the CIE color coordinates for the organic EL device of the second embodiment are listed in Table 2.

Comparative Example 1 (C1)

A comparative blue color filter is made in the same way as the blue color filter of the first embodiment except that copper phthalocyanine blue is used as the pigment. The spectroscopic transmittance of the blue color filter of comparative example 1 is measured and described by curve "c" in FIG. 2.

An organic EL device is made using the blue color filter of comparative example 1. The conversion efficiency and the x- and y-values on the CIE color coordinates are measured. The conversion efficiency and the x- and y-values on the CIE color coordinate for the organic EL device for comparative example 1 are listed in Table 2.

Comparative Example 2 (C2)

An optically-transparent photo-polymerizing resin (259PAP5 supplied from Nippon Steel Chemical Co., Ltd.), containing 2 weight parts of Basic Violet 15 as a blue dye with respect to 100 weight parts of the solid component of the resin, is spin-coated and dried, resulting in a blue material film. The blue material film is exposed to light from a high-pressure mercury lamp through a mask to obtain a stripe pattern having a 0.33 mm line pitch and a 0.12 mm gap. A stripe pattern is formed by developing the exposed blue material film with alkaline aqueous solution. Then, by drying the developed stripe pattern, a blue color filter having a stripe pattern having a 0.33 mm line pitch and a 0.07 mm gap is obtained. The spectroscopic transmittance of the blue color filter of comparative example 2 is measured and described by curve "d" in FIG. 2.

An organic EL device is made using the blue color filter of comparative example 2. The conversion efficiency and the x- and y-values on the CIE color coordinates of the organic EL device of comparative example 2 are measured and listed in Table 2.

Table 2 compares the conversion efficiencies, the x- and y-values on the color coordinates and the transmittance values at wavelengths of 470 nm and 500 nm for the blue color filters of the embodiments of the present invention and the comparative examples.

TABLE 2

| | Conversion efficiencies (%) | CIE chromaticity coordinates | | Transmittance (%) | |
|---|---|---|---|---|---|
| | | x values | y values | 470 nm | 500 nm |
| E1 | 35 | 0.13 | 0.10 | 87 | 59 |
| E2 | 32 | 0.12 | 0.09 | 87 | 59 |
| C1 | 40 | 0.16 | 0.14 | 66 | 67 |
| C2 | 15 | 0.12 | 0.10 | 73 | 33 |

A comparison of the measured values for the embodiments and the comparative examples reveals the following. Referring now to FIG. 2, the blue color filter of the first embodiment has a transmittance peak at 450 nm, indicating that the blue color filter of the first embodiment contributes more to the blue color purity than the blue color filter of comparative example 1. The blue color transmittance of the blue color filter of the first embodiment is higher than those of the blue color filters of the comparative examples 1 and 2, indicating that the blue color filter of the first embodiment exhibits an excellent energy conversion efficiency. The transmittance of the blue color filter of the second embodiment is low in the long wavelength range, contributing more to realizing a high color purity as explained later.

Although better color purity is obtained as the x- and y-values as the blue color purity indexes are smaller than the NTSC hue (0.14, 0.08), the luminance of the light transmitted from the same light source is lower at smaller x- and y-values. The x- and y-values for the organic EL devics of the first and second embodiments are smaller than those of the organic EL device of comparative example 1, confirming that the dye including the cyanine dye described by the structural formula (I) is effective in improving blue color purity. The y-value (0.09) of the organic EL plate of the second embodiment, where the cyanine dye described by structural formula (II) is added, is quite near to the y-value (0.08) of the NTSC hue.

Higher luminance is obtained with increasing conversion efficiency. Although the x- and y-values for the organic EL device of comparative example 2 are smaller than those for the organic El devices of the first and second embodiments, the conversion efficiency of the organic EL device of comparative example 2 is small. Thus, the blue color filters of the first and second embodiments facilitate an increase in conversion efficiency and obtaining blue light with high luminance.

The blue color filter according to the invention, that includes a photosensitive resin and a dye containing at least a cyanine dye described by structural formula (1), exhibits low optical transmittance between 500 and 550 nm, high optical transmittance at 450 nm and an excellent blue color purity. The organic EL device, including the blue color filter of the invention and an organic EL element, emits highly pure blue light at high luminance.

Since the cyanine dye described by the structural formula (I) is chemically and thermally very stable, the blue color filter of the present invention posses high thermal resistance and can be made without using the pigment dispersion method. Since the pigment dispersion method is not used, the blue color filter according to the invention can be made by a simple manufacturing process.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A blue color filter comprising:
a photosensitive resin; and
a dye;
wherein said dye contains at least a first cyanine dye described by the following structural formula (I):

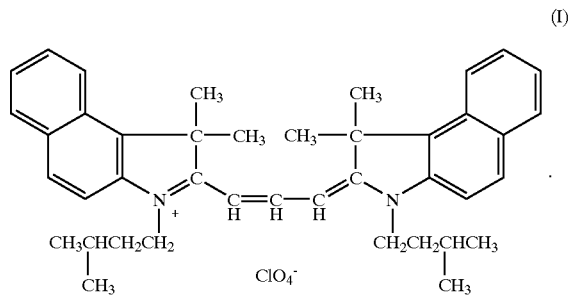

(I)

2. The blue color filter according to claim 1, wherein said blue color filter contains from 0.5 to 30 weight parts of said first cyanine dye with respect to 100 weight parts of said photosensitive resin.

3. The blue color filter according to claim 1, wherein said dye further contains a second cyanine dye described by the following structural formula (II):

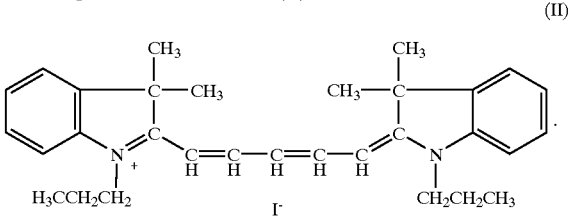

(II)

4. The blue color filter according to claim 3, wherein said blue color filter contains from 0.5 to 1.5 weight parts of said second cyanine dye with respect to 1 weight part of said first cyanine dye.

5. A blue color filter comprising:
   a photosensitive resin; and
   a pigment;
      wherein said pigment contains at least a first cyanine dye described by the following structural formula (I):

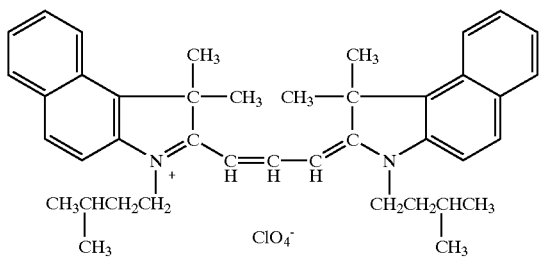

(I)

6. The blue color filter according to claim 5, wherein said pigment containing said first cyanine dye further contains copper phthalocyanine blue.

7. An organic electroluminescent device comprising:
   a blue color filter;
   an organic electroluminescent element laminated on said blue color filter;
   said blue color filter containing a photosensitive resin, and a dye; and
      wherein said dye contains at least a first cyanine dye described by the following structural formula (I):

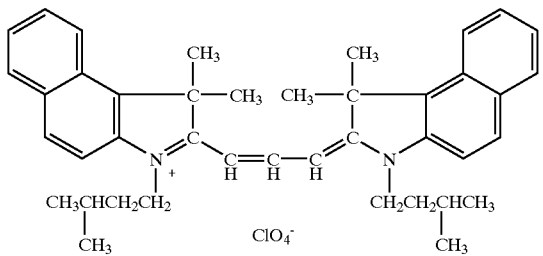

(I)

8. The organic electroluminescent device according to claim 7, wherein said blue color filter contains from 0.5 to 30 weight parts of said first cyanine dye with respect to 100 weight parts of said photosensitive resin.

9. The organic electroluminescent device according to claim 7, wherein said dye further contains a second cyanine dye described by the following structural formula (II):

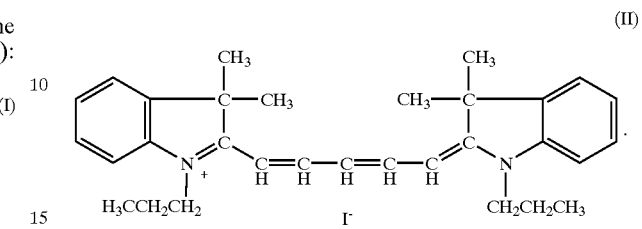

(II)

10. The organic electroluminescent device according to claim 9, wherein said blue color filter contains from 0.5 to 1.5 weight parts of said second cyanine dye with respect to 1 weight part of said first cyanine dye.

11. An organic electroluminescent device comprising:
   a blue color filter; and
   an organic electroluminescent element laminated on said blue color filter;
   said blue color filter containg a photosensitive resin, and a pigment containing at least a first cyanine dye described by the following structural formula (I):

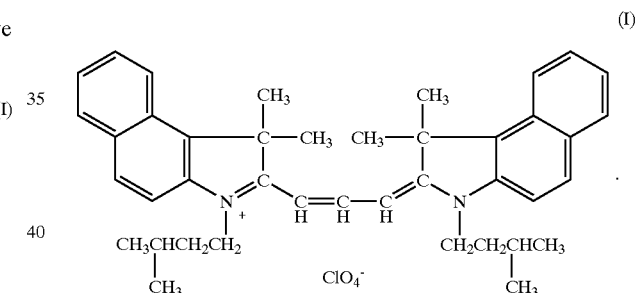

(I)

12. The organic electroluminescent device according to claim 11, wherein said pigment further contains copper phthalocyanine blue.

* * * * *